United States Patent
Marks et al.

(10) Patent No.: US 12,135,364 B2
(45) Date of Patent: Nov. 5, 2024

(54) BEACON SYSTEM

(71) Applicant: Target Brands, Inc., Minneapolis, MN (US)

(72) Inventors: Eric A. Marks, Crystal, MN (US); Keaton F. Van't Hull, Minneapolis, MN (US); Patrick M. Greenwell, Oakdale, MN (US)

(73) Assignee: Target Brands, Inc., Minneapolis, MN (US)

( * ) Notice: Subject to any disclaimer, the term of this patent is extended or adjusted under 35 U.S.C. 154(b) by 398 days.

(21) Appl. No.: 17/498,974

(22) Filed: Oct. 12, 2021

(65) Prior Publication Data

US 2023/0112510 A1    Apr. 13, 2023

(51) Int. Cl.
| | |
|---|---|
| *G01S 1/00* | (2006.01) |
| *G01S 1/04* | (2006.01) |
| *H04W 4/021* | (2018.01) |
| *H04W 4/80* | (2018.01) |

(52) U.S. Cl.
CPC .............. *G01S 1/042* (2013.01); *G01S 1/047* (2013.01); *H04W 4/021* (2013.01); *H04W 4/80* (2018.02)

(58) Field of Classification Search
CPC . G01S 1/042; G01S 1/047; G01S 1/02; G06F 1/3231; G06F 1/3287; H04W 4/80; H04W 4/021
USPC ......................................... 342/386, 385, 368
See application file for complete search history.

(56) References Cited

U.S. PATENT DOCUMENTS

| | | | |
|---|---|---|---|
| 9,652,124 B2 | 5/2017 | Cotier et al. | |
| 9,883,301 B2* | 1/2018 | Gan | H04R 29/00 |
| 10,007,892 B1 | 6/2018 | Hahn et al. | |
| 10,212,667 B1* | 2/2019 | Govindassamy | H04W 52/0274 |
| 10,291,976 B2* | 5/2019 | Peterson | H03K 17/955 |
| 10,459,103 B1 | 10/2019 | Shi et al. | |
| 10,469,079 B1* | 11/2019 | Khasgiwala | G06F 3/0488 |
| 10,768,682 B2* | 9/2020 | Messely | G08B 29/181 |
| 10,839,417 B2 | 11/2020 | Duggal et al. | |
| 10,966,076 B2* | 3/2021 | Carter | G06F 1/1698 |
| 10,996,736 B2* | 5/2021 | Bachrany | G01R 27/2605 |
| 11,023,940 B1 | 6/2021 | Zadoks et al. | |
| 11,719,718 B2* | 8/2023 | Rivolta | G06N 20/00 702/141 |
| 2006/0163349 A1 | 7/2006 | Neugebauer | |
| 2010/0332283 A1 | 12/2010 | Ng et al. | |
| 2014/0363059 A1 | 12/2014 | Hurewitz | |
| 2018/0288515 A1* | 10/2018 | Peterson | G01D 5/241 |

(Continued)

FOREIGN PATENT DOCUMENTS

CN           112835442 A  *  5/2021    ........... G06F 1/3231

*Primary Examiner* — Chuong P Nguyen
(74) *Attorney, Agent, or Firm* — Theodore M. Magee; Westman, Champlin & Koehler, P.A.

(57) ABSTRACT

An apparatus includes a processor, a transceiver connected to the processor, an integrated circuit connected to the processor, a first proximity sensor configured to provide a first sensor input to the integrated circuit, and a second proximity sensor configured to provide a second sensor input to the integrated circuit. When the integrated circuit determines that the first sensor input represents a first detection event, the processor sets a timer and when the timer expires before the integrated circuit determines that the second sensor input represents a second detection event, the processor sends a message through the transceiver.

19 Claims, 7 Drawing Sheets

(56) References Cited

U.S. PATENT DOCUMENTS

2018/0293877 A1 10/2018 Barth
2020/0285295 A1* 9/2020 Bachrany ............. H03K 17/955
2021/0405142 A1* 12/2021 Pipher ................ G01C 21/3697

* cited by examiner

BEACON SYSTEM

BACKGROUND

Assistance beacons are dedicated devices that are placed in buildings to allow visitors to request assistance. The beacons typically include a button that the visitor presses to request assistance.

The discussion above is merely provided for general background information and is not intended to be used as an aid in determining the scope of the claimed subject matter. The claimed subject matter is not limited to implementations that solve any or all disadvantages noted in the background.

SUMMARY

An apparatus includes a processor, a transceiver connected to the processor, an integrated circuit connected to the processor, a first proximity sensor configured to provide a first sensor input to the integrated circuit, and a second proximity sensor configured to provide a second sensor input to the integrated circuit. When the integrated circuit determines that the first sensor input represents a first detection event, the processor sets a timer and when the timer expires before the integrated circuit determines that the second sensor input represents a second detection event, the processor sends a message through the transceiver.

In accordance with a further embodiment, an apparatus includes a processor, an integrated circuit, a first proximity sensor configured to provide a first sensor input to the integrated circuit, and a second proximity sensor configured to provide a second sensor input to the integrated circuit. When the integrated circuit determines that the first sensor input represents a first detection event, the processor sets a timer such that the processor ignores detection events determined by the integrated circuit until the timer expires.

In accordance with a still further embodiment, a system includes a system transceiver, a system processor, connected to the system transceiver, a task generator obtaining messages produced by the system processor, and a first beacon and a second beacon. Each beacon has identical electrical components comprising a first proximity sensor, a second proximity sensor and a transceiver. The first proximity sensor of the first beacon generates a sensor signal that causes the transceiver of the first beacon to send a first signal that is received by the system transceiver and is converted into a first message by the system processor. The first proximity sensor of the second beacon generates a sensor signal that causes the transceiver of the second beacon to send a second signal that is received by the system transceiver and is converted into a second message by the system processor. The task generator interprets the first message as being related to a first task type and the second message as being related to a second task type.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DETAILED DESCRIPTION

The embodiments described below provide a touchless assistance beacon that a guest activates by placing their hand near a first proximity sensor. In response to this activation, the assistance beacon sends a message to a network to notify employees of the assistance request. When an employee reaches the beacon in response to the request for assistance, the employee places their hand near a second proximity sensor in the beacon. This causes the beacon to send a second message indicating the request for assistance has been addressed.

Figure 1:
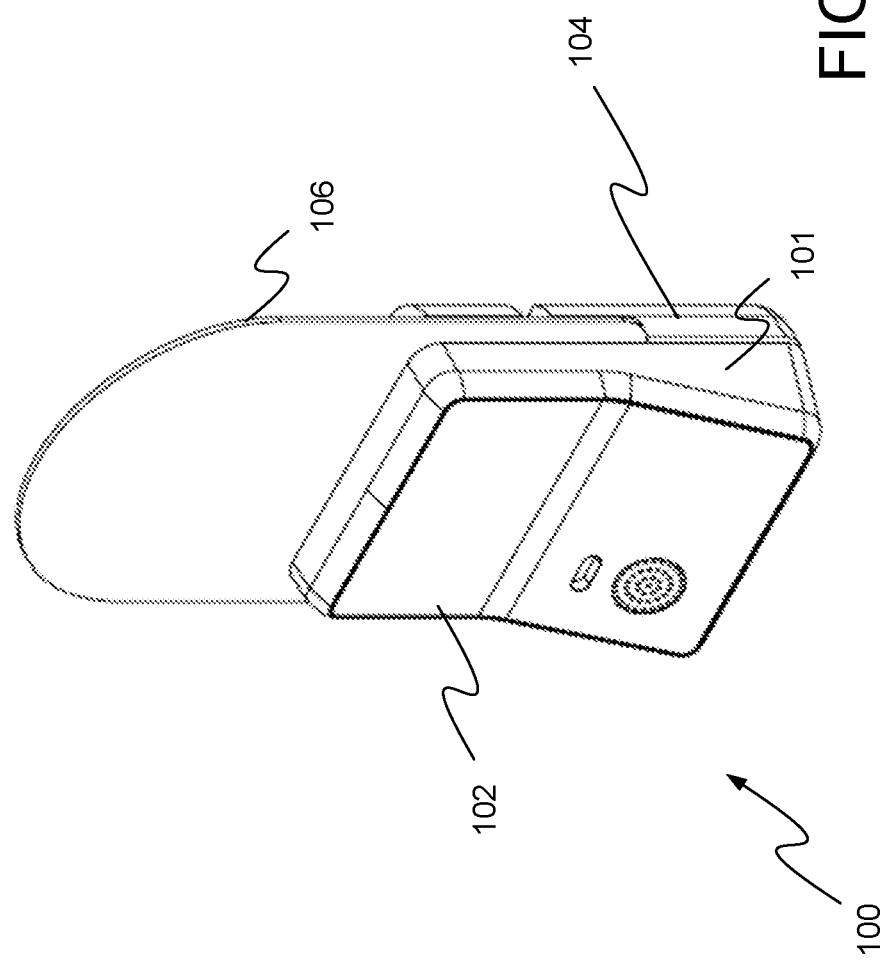
FIG. 1 is a perspective view of a beacon in accordance with one embodiment.
Figure 2:
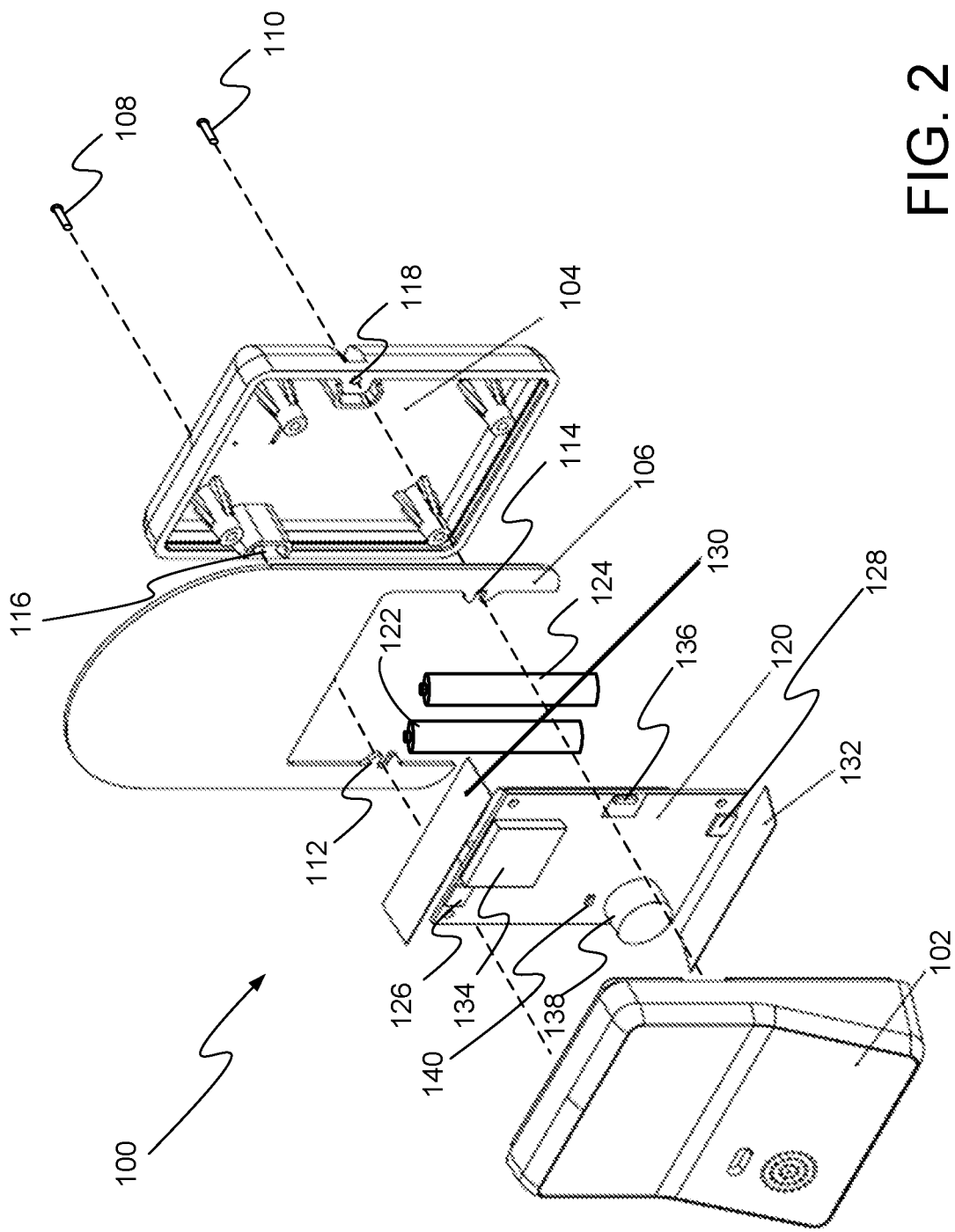
FIG. 2 is an exploded perspective view of the beacon of FIG. 1.

FIG. 1 provides a perspective view and FIG. 2 provides an exploded perspective view of a beacon 100 in accordance with one embodiment. Beacon 100 includes a housing 101 and a label 106. Housing 101 includes a front housing portion 102 and a back housing portion 104 that are connected together by screws 108 and 110. Label 106 includes tabs 112 and 114 that are snap fit into recesses 116 and 118 defined in back housing portion 104 and engage screws 108 and 110 passing between back housing portion 104 and front housing portion 102. Label 106 is removable from housing 101 so that label 106 can be easily changed with a different label 106.

Housing 101 contains a printed circuit board 120 and two batteries 122 and 124. Batteries 122 and 124 reside in a holder (not shown) on the back side of printed circuit board 120 and provide electrical power to components mounted on printed circuit board 120. The components on printed circuit board 120 include a top proximity sensor 126 and a bottom proximity sensor 128 that are connected to respective electrodes 130 and 132. In accordance with one embodiment, top proximity sensor 126 is located on an opposite end of beacon 100 from bottom proximity sensor 128. In accordance with one embodiment, proximity sensors 126 and 128 are capacitive sensors that provide a capacitance that changes as objects approach the sensors. The components on printed circuit board 120 also include a module 134 that includes a processor, clock, memory, and transceiver as discussed further below. The transceiver of module 134 is connected to an antenna 136 that permits beacon 100 to communicate wirelessly through a radio frequency communication standard such as LoRa. A light emitting diode 140 and a piezo element 138 are also provided on printed circuit board 120. Piezo element 138 acts as a simple sound generator. Beacon 100 is mountable on structures such as walls, pillars and shelving.

Figure 3:
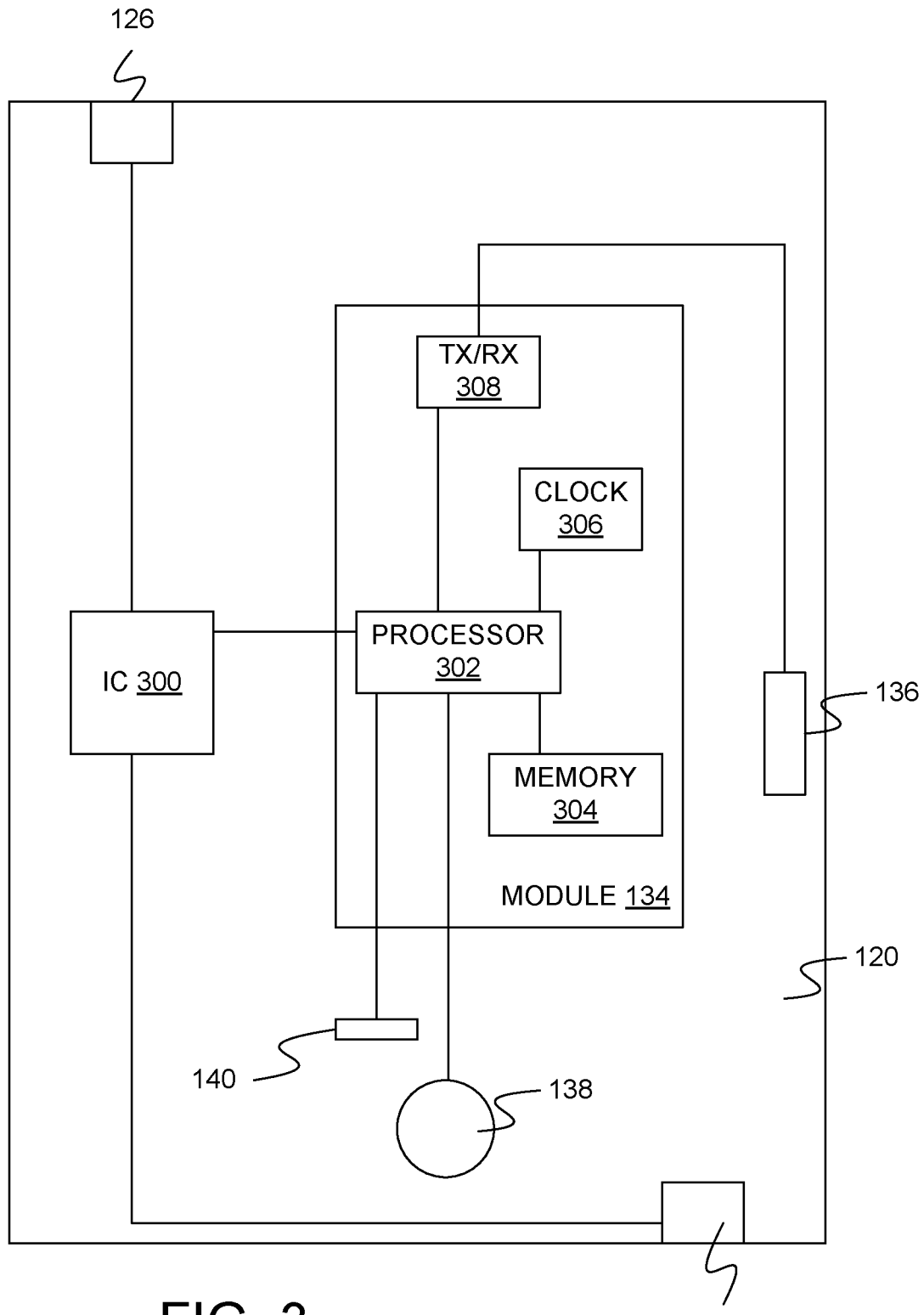
FIG. 3 is a block diagram of components inside the beacon.

FIG. 3 provides a block diagram of the components on printed circuit board 120. As shown in FIG. 3, top proximity sensor 126 and bottom proximity sensor 128 are connected to an integrated circuit 300 that determines when the analog capacitance values provided by proximity sensors 126 and 128 represent detection events. In accordance with one embodiment, integrated circuit 300 determines when a sensor signal represents a detection event by determining the difference between the sensor signal and a baseline capacitance for the sensor that is stored within integrated circuit 300. When integrated circuit 300 determines that the analog signal of one of proximity sensors 126 or 128 indicates that an object is within a threshold distance of the sensor, integrated circuit 300 alters a value of a detection flag in a memory register located with integrated circuit 300 and notifies a processor 302 in module 134. Processor 302 then reads the memory registers in integrated circuit 300 to determine the current digital values of the detection flags for proximity sensors 126 and 128.

In addition to processor 302, module 134 includes a memory 304, a clock 306 and a transceiver 308. Memory 304 includes firmware representing instructions executed by processor 302, configurable settings that control the operation of beacon 100, and an identifier for beacon 100. Clock 306 includes an oscillator and circuit elements that together provide a current time value to processor 302 when requested. This time value is used to control various timers implemented by processor 302 and to control when sensors 126 and 128 are powered on and off as described further below. Transceiver 308 is capable of transmitting and receiving radio frequency signals using antenna 136. In accordance with one embodiment, transceiver 308 implements the LoRa communication standard which allows for low data rate communications at 900 MHz.

As shown in FIG. 3, processor 302 is also connected to light emitting diode 140 and piezo element 138 such that processor 302 is able to activate light emitting diode 140 and piezo element 138.

Figure 4:
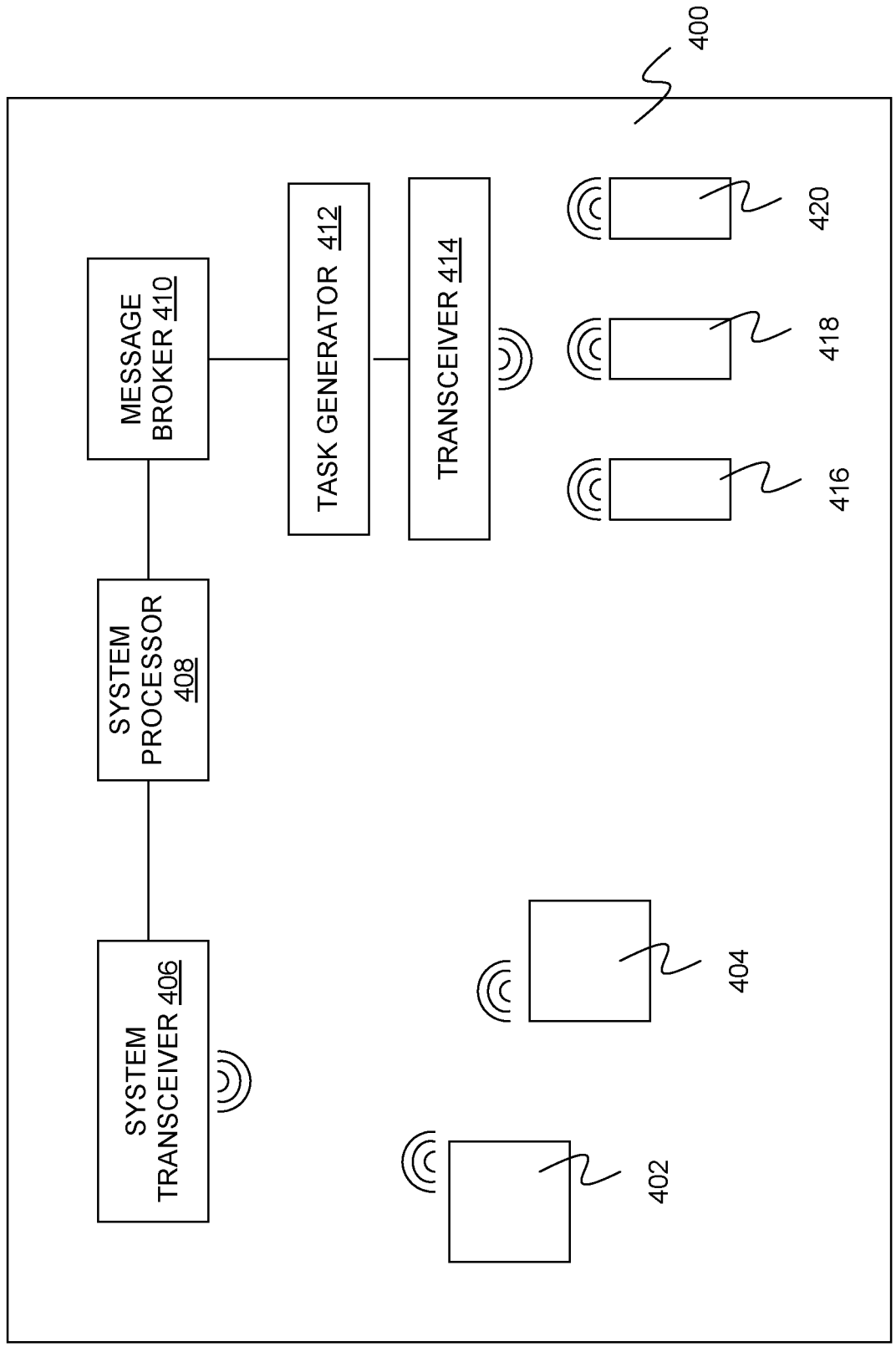
FIG. 4 is a block diagram of a system in accordance with one embodiment.

FIG. 4 provides a block diagram of a system 400 in which beacon 100 can be utilized. System 400 includes a plurality of beacons such as beacons 402 and 404, which are identical to beacon 100. Beacons 402 and 404 communicate wirelessly with a system transceiver/gateway 406 that receives radio signals from beacons 402 and 404 and converts the radio signals into messages that it sends to a system processor 408. System transceiver 406 also converts messages received from system processor 408 into radio signals that it broadcasts to beacons 402 and 404.

System processor 408 provides the messages it receives to a message broker 410, which stores the messages in a queue. The messages are then requested one at a time by a task generator 412, which uses the messages to assign tasks to various employees. In accordance with one embodiment, task generator 412 sends messages through a separate transceiver 414, such as a WiFi transceiver, to one or more handheld devices, such as devices 416, 418 and 420, that inform employees of the tasks assigned to them.

The tasks assigned to the employees are determined by task generator 412 based on the identity of the beacon that sent the message. For example, for some beacons in system 400, activation of the beacon's sensor causes task generator 412 to assign an assistance task to an employee that requires the employee to go to the beacon and offer assistance to the guest standing at the beacon. For other beacons in system 400, activation of the beacon sensor causes task generator 412 to assign a cleaning task to an employee requiring the employee to clean the area where the beacon is located. To determine which task to create, task generator 412 uses an identifier of the beacon provided in the message from the beacon to retrieve a task type associated with the beacon. Task generator 412 then uses this task type to create and assign the task to one or more employees.

In systems where different beacons are associated with different task types, the labels 106 that are snap fit to the housings are different for beacons associated with different task types. Thus, a beacon associated with a task of guest assistance will have a label 106 that indicates that activating the beacon will bring an employee to the beacon to assist the guest. A beacon associated with a task of cleaning a restroom will have a label 106 that indicates that activating the beacon will direct someone to come clean the restroom. Note that although the labels 106 will be different, the remainder of the beacons will be identical to each other.

Figure 5:
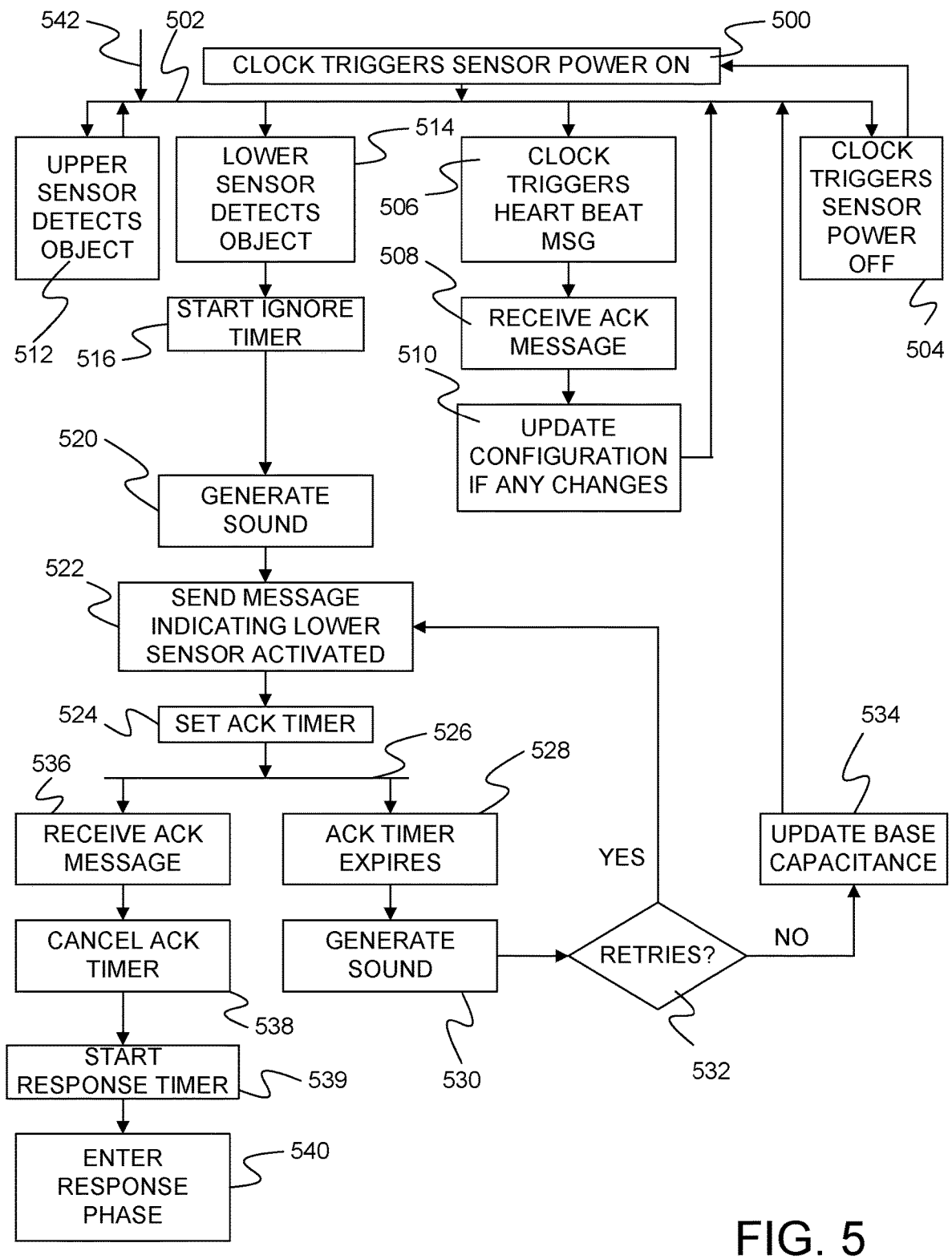
FIG. 5 is a flow diagram of a request phase of a process in accordance with one embodiment.

FIG. 5 provides a flow diagram of a method performed by beacon 100 during a request phase of operation. At step 500 of FIG. 5, processor 302 turns on proximity sensors 126 and 128 by writing a value to a register in integrated circuit 300. In accordance with one embodiment, processor 302 periodically compares the time produced by clock 306 to a time stored in memory 304 that indicates when the sensors are to be powered on. When the time produced by clock 306 matches the time set in memory, processor 302 turns on the sensors at step 500.

In accordance with one embodiment, processor 302 turns on the sensors at a particular time each day. For example, this time can correspond with an opening time for a retail store. By keeping the sensors in an off state when the store is closed, the embodiment reduces battery usage and thereby extends the lifetime of the beacon.

After the sensors have been powered on, beacon 100 enters a waiting state 502 in which it waits for one of several possible events to occur. During waiting state 502, processor 302 periodically compares the time produced by clock 306 to a time stored in memory 304 that indicates when the sensors are to be powered off. When the time produced by clock 306 matches the time set in memory 304, processor 302 turns off the sensors at step 504 and returns to step 500 to await the set time for when the sensors are to be powered on again. In accordance with one embodiment, the time for turning off the sensors corresponds with a closing time for the retail store.

During waiting state 502, processor 302 also periodically compares the time produced by clock 306 to a time stored in memory 304 for generating a "heartbeat" message. When the time produced by clock 306 matches the "heartbeat" time set in memory 304, processor 302 generates a message at step 506 indicating the identity of the beacon and the current battery life of batteries 122 and 124. In accordance with one embodiment, the battery life comprises a length of time until beacon 100 is expected to stop functioning due to low battery levels. In other embodiments, the battery life comprises an indication of the percentage of charge left in the batteries. Processor 302 then transmits the message to system transceiver 406 using transceiver 308 and antenna 136.

At step 508, transceiver 308 receives an acknowledgment message from system transceiver 406 and provides the acknowledgment message to processor 302. Such acknowledgment messages can include updates to one or more configuration parameters such as the current time. At step 510, processor 302 uses the configuration parameters in the acknowledgment message to update the configuration values in memory 304. Processor 302 then returns to waiting state 502.

While in waiting state 502, processor 302 can receive a notification from integrated circuit 300 indicating that upper proximity sensor 126 or lower proximity sensor 128 have been activated. When the detection flag for upper proximity sensor 126 indicates that upper proximity sensor 126 has sensed an object within a threshold distance of the sensor at step 512, processor 302 ignores the detection and simply returns to waiting state 502.

When the detection flag for lower proximity sensor 128 indicates that lower proximity sensor 128 has sensed an objected within a threshold distance of the sensor at step 514, processor 302 starts an "ignore" timer at step 516. Until the ignore timer expires, processor 302 does not poll integrated circuit 300 for the detection flags of proximity sensors 126 and 128. As a result, processor 302 ignores any proximity detections produced by proximity sensors 126 and 128 during that time period.

The ignore timer helps to prevent two different unwanted behaviors by processor 302. First, by ignoring any proximity detections by upper proximity sensor 126, processor 302 is prevented from reacting to an inadvertent activation of upper proximity sensor 126 by the same person who activated lower proximity sensor 128. Such inadvertent activation can occur because the sensing regions of upper proximity sensor 126 and lower proximity sensor 128 overlap along the vertical center of housing 101. As a result, if the guest activates lower proximity sensor 128 using an upward gesture, it is possible that the guest's hand will also activate upper proximity sensor 126. However, as discussed further below, activation of upper proximity sensor 126 is intended to indicate that an employee has performed the task assigned to them in response to activation of lower proximity sensor 128. If processor 302 reacted to the guest's inadvertent activation of upper proximity sensor 126, the system would incorrectly believe that the task assigned to the employee has already been performed. By using the ignore timer, processor 302 is prevented from introducing this error into the system.

The second unwanted behavior prevented by the ignore timer, is the sending of multiple messages for a single activation by a user. For example, if a user waves their hand around the bottom of beacon 100, lower proximity sensor 128 will produce multiple detection events. However, the guest has only made a single request with this gesture. By using the ignore timer, processor 302 treats such gestures as a single request instead of multiple requests.

At step 520, processor 302 generates a sound through sound generator/piezo element 138 to provide feedback to the guest that they successfully activated the beacon. In accordance with further embodiments, processor 302 also activates light emitting diode 140.

At step 522, processor 302 constructs and sends a message through transceiver 308 to system transceiver 406. In accordance with one embodiment, the message includes a unique identifier for the beacon, the current battery life of the batteries in the beacon, and an indication that the lower proximity sensor was activated. System transceiver 406 receives the message in a radio signal and converts the signal into a digital message carried on hardware. System transceiver 406 provides the message to system processor 408, which forwards the message to message broker 410. Upon receiving the message, system processor 408 constructs and returns an acknowledgment message that passes through system transceiver 406 back to the beacon. Message broker 410 places the message on a message queue and provides the message to task generator 412 in response to a request for messages sent by task generator 412. Task generator 412 creates one or more tasks based on the message and sends messages to one or more devices 416, 418 and 420 to notify the appropriate employees of the new tasks.

At step 524, after sending the message indicating the activation of lower proximity sensor 128, processor 302 sets an acknowledgement timer. The acknowledgement timer is set to ensure that an acknowledgement message is received from system processor 408 in a reasonable amount of time. Processor 302 then enters a wait state 526.

If no acknowledgment message is received during wait state 526, the acknowledgment timer will expire at step 528. In response, processor 302 generates a sound through piezo element 138 at step 530. In accordance with one embodiment, the sound is indicative of something going wrong.

At step 532, processor 302 determines if any retries are available for resending the message indicating that lower proximity sensor 128 was activated. In accordance with one embodiment, a configurable parameter in memory 304 indicates the number of retries that are available for resending the message. Each time a message is sent, the number of available retries for that message is reduced by one. If at least one retry is available at step 532, processor 302 returns to step 522 and resends the message. When all of the retries have been exhausted for this message, processor 302 determines whether the baseline capacitances of the lower proximity sensor and the upper proximity sensor need to be adjusted at step 534.

Step 534 is provided to allow the beacon to dynamically adjust to changes in its environment. When a beacon is positioned in its environment without any guests around, the proximity sensors will sense a steady-state capacitance that is stored as a baseline capacitance in integrated circuit 300. When a guest activates the lower proximity sensor, the capacitance generally changes from the baseline value to a different value and then returns to the baseline value. However, when the environment around the beacon is changed, the steady-state capacitances detected by the proximity sensors will change. In step 534, processor 302 and integrated circuit 300 identify that the steady-state capacitance of one or both of the proximity sensors has changed and then store the new steady-state capacitance as the baseline capacitance for the sensor. Although step 534 is shown in FIG. 5 as being limited to a particular part of the flow diagram, in most embodiments, integrated circuit 300 is continually assessing whether one or both of the sensors have been activated for more than a threshold period of time, such as ten seconds. When one of the sensors has been activated for more than the threshold period of time, integrated circuit 300 notifies processor 302 and processor 302 instructs integrated circuit 300 to update the base capacitance of the sensors.

Because the retries for sending the detection message have been exhausted at step 532, the process returns to waiting state 502 after updating the base capacitances at step 534. Thus, if no acknowledgment is ever received at waiting state 526 for any of the messages that are sent, the process abandons this detection message and returns to wait for a new detection event.

However, if an acknowledgment message is received during waiting state 526, as indicated by step 536, the acknowledgement timer is canceled at step 538 and a response timer is started at step 539. The response timer represents the maximum amount of time an employee is given to indicate that they have completed the task assigned to them by task generator 412. Once the response timer has been set, the beacon enters a response phase 540 that is depicted in the flow diagram of FIG. 6.

Figure 6:
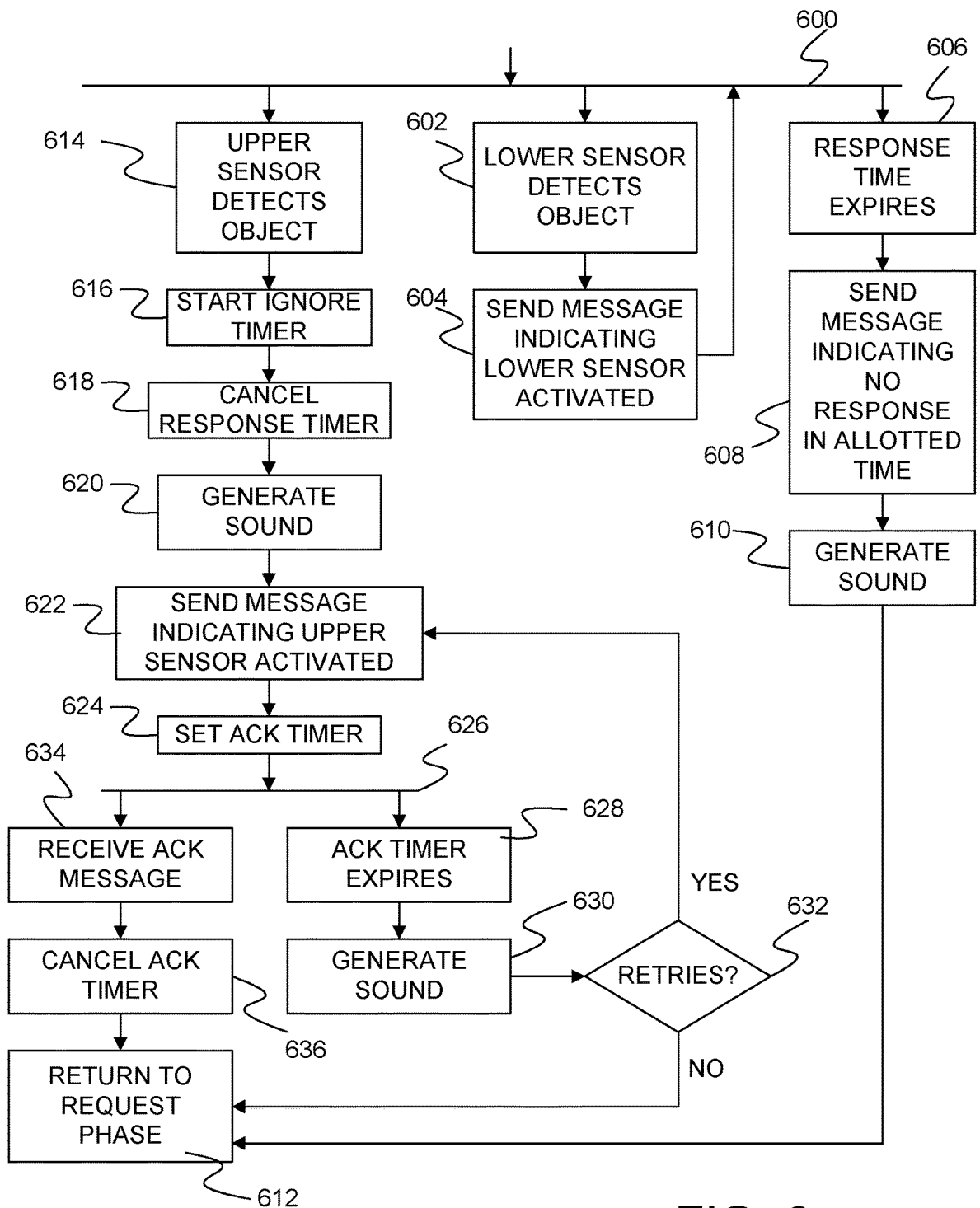
FIG. 6 is a flow diagram of a response phase of a process in accordance with one embodiment.

The beacon enters the response phase in a waiting state 600 of FIG. 6. When lower proximity sensor 128 detects an object at step 602, processor 302 sends a new message indicating that lower proximity sensor 128 was activated. This message is provided to task generator 412 to allow task generator 412 to keep track of the number of times a guest activates the beacon. This can be an indication of the level of need that the guest has and can be used by task generator 412 to set additional tasks for additional employees so that the guest's needs can be met. After sending the message at step 604, processor 302 returns to waiting state 600. Note that the response timer is not altered by the additional activation of lower proximity sensor 128 and continues to run while the message is sent. Thus, the employee must still satisfy the original response time.

If the response timer expires during waiting state 600, as indicated by step 606, processor 302 sends a message at step 608. This message is sent to system processor 408 through system transceiver 406 to indicate that no employee completed the task in the allotted response time. This message is sent to prevent employees from indicating that they completed the task through their hand-held device 416, 418, 420 when in fact they did not go to the beacon to complete the task. At step 610, processor 302 drives piezo element 138 to issue a sound indicative of something having gone wrong with the guest's request. After step 610, the process returns to the request phase at step 612 by returning to waiting state 502 of FIG. 5.

Returning to waiting state 600, when an employee has completed the task assigned to them by task generator 412, they make a gesture toward upper proximity sensor 126 in order to indicate that the task is complete. In accordance with some embodiments, the task is simply to arrive at the beacon to assist the guest. In accordance with other embodiments, the task is to clean an area near the beacon.

When upper proximity sensor 126 detects the employee's gesture at step 614, processor 302 starts the ignore timer at step 616 such that processor 302 will not check for sensor detection events in the registers of integrated circuit 300 until the ignore timer expires. This prevents processor 302 from reacting to an inadvertent activation of lower proximity sensor 128 by the same person who activated upper proximity sensor 128. Such inadvertent activation can occur because the sensing regions of upper proximity sensor 126 and lower proximity sensor 128 overlap along the vertical center of housing 101. As a result, if the employee activates upper proximity sensor 126 using a downward gesture, it is possible that the employee's hand will also activate lower proximity sensor 128. However, as discussed above, activation of lower proximity sensor 128 is intended to indicate that a guest is requesting assistance of some kind. If processor 302 reacted to the employee's inadvertent activation of lower proximity sensor 128, the system would incorrectly believe that a new task should be assigned to the employee to respond to this new request from a guest. By using the ignore timer, processor 302 is prevented from introducing this error into the system.

At step 618, processor 302 cancels the response timer since an employee has responded to the request. At step 620, processor 302 generates a sound through piezo element 138 to provide feedback that the employee's gesture was detected. In accordance with one embodiment, the sound generated at step 620 is different from the sound generated at step 520 so as to make it clear which proximity sensor was activated by the gesture.

At step 622, processor 302 sends a message to system processor 408 to indicate that upper proximity sensor 126 detected a gesture. In accordance with one embodiment, the message includes a unique identifier for the beacon, the current battery life of the batteries in the beacon and an indication that the upper proximity sensor was activated. System transceiver 406 receives the message in a radio signal and converts the signal into a digital message that it provides to system processor 408. Upon receiving the message, system processor 408 constructs and returns an acknowledgment message that passes through system transceiver 406 back to the beacon. System processor 408 also forwards the received message to message broker 410. Message broker 410 places the message on a message queue and provides the message to task generator 412 in response to a request for messages sent by task generator 412. Task generator 412 marks one or more tasks as completed based on the message.

After sending the message, processor 302 starts the acknowledgment timer at step 624. Processor 302 then enters waiting state 626. If the acknowledgment timer expires during waiting state 626, as indicated by state 628, processor 302 generates a sound through piezo element 138 at step 630. In accordance with one embodiment, the sound indicates that something has gone wrong with notifying the system that the task has been completed.

After generating the sound, processor 302 determines if any retries are available for resending the message indicating that upper proximity sensor 126 was activated. In accordance with one embodiment, a configurable parameter in memory 304 indicates the number of retries that are available for resending the message. Each time a message is sent, the number of available retries for that message is reduced by one. If at least one retry is available at step 632, processor 302 returns to step 622 and resends the message. When all of the retries have been exhausted for this message, processor 302 returns to the request phase at step 612, which involves returning to waiting state 502 of FIG. 5.

If an acknowledgement message is received at step 634 before the acknowledgement timer expires, processor 302 cancels the acknowledgement timer at step 636 and returns to the request phase at step 612, which involves returning to waiting state 502 of FIG. 5.

Figure 7:
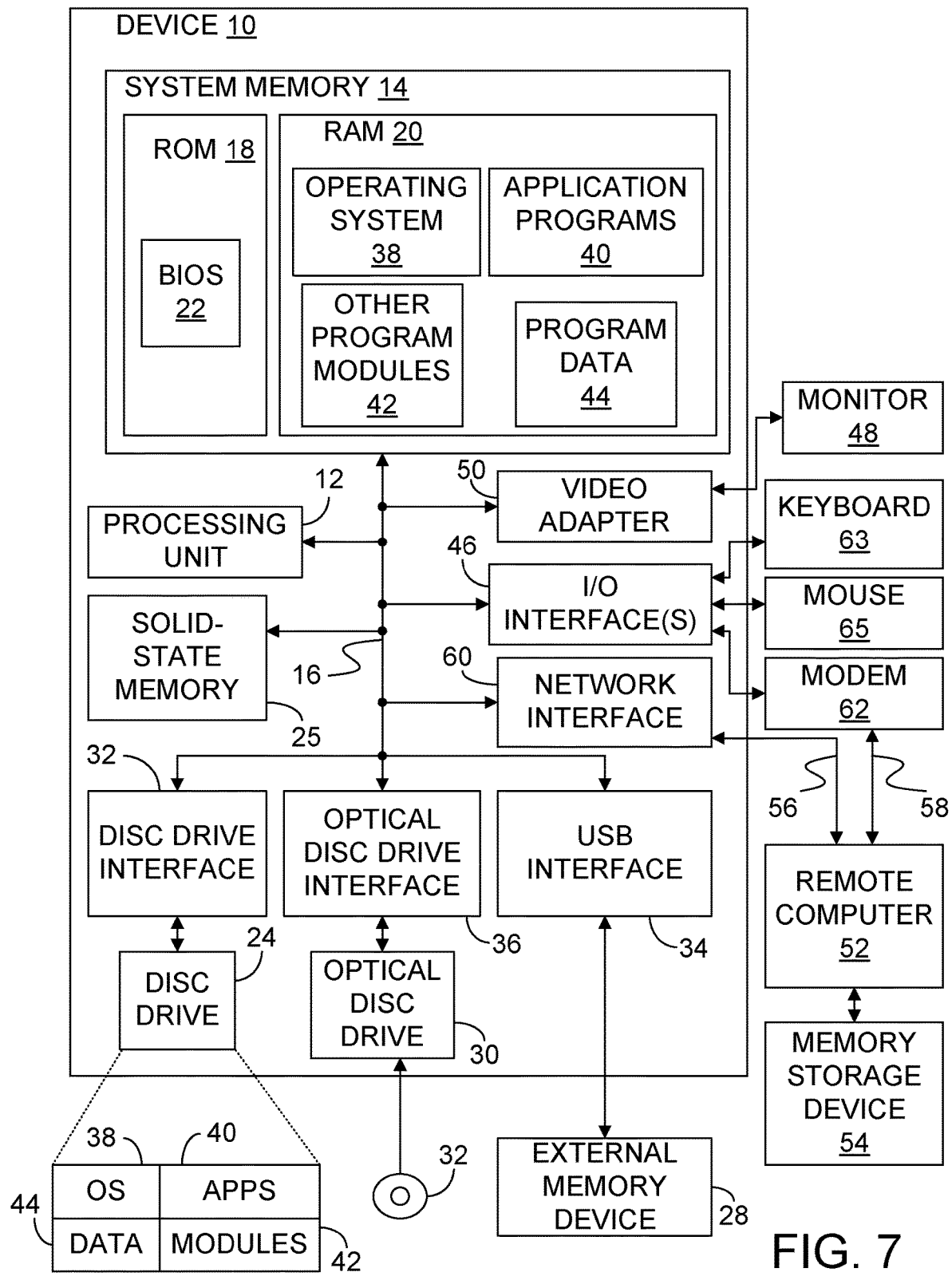
FIG. 7 is a block diagram of a computing device that is used to implement some aspects of the invention.

FIG. 7 provides an example of a computing device 10 that can be used to implement one or more of the system processor and task generator discussed above. Computing device 10 includes a processing unit 12, a system memory 14 and a system bus 16 that couples the system memory 14 to the processing unit 12. System memory 14 includes read only memory (ROM) 18 and random-access memory (RAM) 20. A basic input/output system 22 (BIOS), containing the basic routines that help to transfer information between elements within the computing device 10, is stored in ROM 18. Computer-executable instructions that are to be executed by processing unit 12 may be stored in random access memory 20 before being executed.

Computing device 10 further includes an optional hard disc drive 24, an optional external memory device 28, and an optional optical disc drive 30. External memory device 28 can include an external disc drive or solid-state memory that may be attached to computing device 10 through an interface such as Universal Serial Bus interface 34, which is connected to system bus 16. Optical disc drive 30 can illustratively be utilized for reading data from (or writing data to) optical media, such as a CD-ROM disc 32. Hard disc drive 24 and optical disc drive 30 are connected to the system bus 16 by a hard disc drive interface 32 and an optical disc drive interface 36, respectively. The drives and external memory devices and their associated computer-readable media provide nonvolatile storage media for the computing device 10 on which computer-executable instructions and computer-readable data structures may be stored. Other types of media that are readable by a computer may also be used in the exemplary operation environment.

A number of program modules may be stored in the drives and RAM 20, including an operating system 38, one or more application programs 40, other program modules 42 and program data 44. In particular, application programs 40 can include programs for implementing any one of the applications discussed above. Program data 44 may include any data used by the systems and methods discussed above.

Processing unit 12, also referred to as a processor, executes programs in system memory 14 and solid-state memory 25 to perform the methods described above.

Input devices including a keyboard 63 and a mouse 65 are optionally connected to system bus 16 through an Input/Output interface 46 that is coupled to system bus 16. Monitor or display 48 is connected to the system bus 16 through a video adapter 50 and provides graphical images to users. Other peripheral output devices (e.g., speakers or printers) could also be included but have not been illustrated. In accordance with some embodiments, monitor 48 comprises a touch screen that both displays input and provides locations on the screen where the user is contacting the screen.

The computing device 10 may operate in a network environment utilizing connections to one or more remote computers, such as a remote computer 52. The remote computer 52 may be a server, a router, a peer device, or other common network node. Remote computer 52 may include many or all of the features and elements described in relation to computing device 10, although only a memory storage device 54 has been illustrated in FIG. 7. The network connections depicted in FIG. 7 include a local area network (LAN) 56 and a wide area network (WAN) 58. Such network environments are commonplace in the art.

The computing device 10 is connected to the LAN 56 through a network interface 60. The computing device 10 is also connected to WAN 58 and includes a modem 62 for establishing communications over the WAN 58. The modem 62, which may be internal or external, is connected to the system bus 16 via the I/O interface 46.

In a networked environment, program modules depicted relative to the computing device 10, or portions thereof, may be stored in the remote memory storage device 54. For example, application programs may be stored utilizing memory storage device 54. In addition, data associated with an application program may illustratively be stored within memory storage device 54. It will be appreciated that the network connections shown in FIG. 7 are exemplary and other means for establishing a communications link between the computers, such as a wireless interface communications link, may be used.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms for implementing the claims.

What is claimed is:

1. An apparatus comprising:
 a processor;
 a transceiver connected to the processor;
 an integrated circuit connected to the processor;
 a first proximity sensor configured to provide a first sensor input to the integrated circuit; and
 a second proximity sensor configured to provide a second sensor input to the integrated circuit;
 the processor is configured to set a timer after the integrated circuit determines that the first sensor input represents a first detection event, and when the timer expires before the integrated circuit determines that the second sensor input represents a second detection event, the processor is configured to send a message through the transceiver.

2. The apparatus of claim 1 wherein the first proximity sensor is located at a different end of the apparatus from the second proximity sensor.

3. The apparatus of claim 1 wherein when the integrated circuit is configured to determine that the first proximity sensor represents the first detection event, the processor is configured to set a second timer such that the processor ignores detection events determined by the integrated circuit until the second timer expires.

4. The apparatus of claim 1 wherein the first proximity sensor comprises a capacitive sensor and the integrated circuit is configured to determine that the first sensor input represents the first detection event by comparing the first sensor input to a baseline capacitance, wherein the apparatus changes the baseline capacitance to adapt to changes in a steady-state capacitance of the capacitive sensor.

5. The apparatus of claim 1 further comprising a clock providing a current time, wherein the processor is configured to turn off the first proximity sensor and the second proximity sensor at a first time provided by the clock and is configured to turn back on the first proximity sensor and the second proximity sensor at a second time provided by the clock.

6. The apparatus of claim 1 further comprising a sound generator wherein when the timer expires before the integrated circuit determines that the second sensor input represents the second detection event, the processor is configured to cause the sound generator to generate a sound.

7. The apparatus of claim 1 wherein before the timer is set, the processor is configured to refrain from sending a message through the transceiver when the integrated circuit determines that the second sensor input represents the second detection event and after the timer is set but before the timer expires, the processor is configured to send a message when the integrated circuit determines that the second sensor input represents the second detection event.

8. An apparatus comprising:
 a processor;
 an integrated circuit;
 a first proximity sensor configured to provide a first sensor input to the integrated circuit;
 a second proximity sensor configured to provide a second sensor input to the integrated circuit; and
 a transceiver;
 wherein the processor is configured to set a timer when the integrated circuit determines that the first sensor input represents a first detection event, such that the processor ignores detection events determined by the integrated circuit until the timer expires; and
 wherein when the integrated circuit determines that the first sensor input represents the first detection event, the processor is configured to set a second timer and when the second timer expires before the integrated circuit determines that the second sensor input represents a second detection event, the processor is configured to send a message through the transceiver.

9. The apparatus of claim 8 wherein before the second timer is set, the processor is configured to refrain from sending a message through the transceiver when the integrated circuit determines that the second sensor input represents the second detection event and after the timer is set but before the timer expires, the processor is configured to send a message when the integrated circuit determines that the second sensor input represents the second detection event.

10. The apparatus of claim 8 wherein the first proximity sensor is located at an opposite end of the apparatus from the second proximity sensor.

11. The apparatus of claim 8 wherein the first proximity sensor comprises a capacitive sensor and the integrated circuit is configured to determine that the first sensor input represents the first detection event by comparing the first sensor input to a baseline capacitance, wherein the apparatus changes the baseline capacitance to adapt to changes in a steady-state capacitance of the capacitive sensor.

12. A system comprising:
a system transceiver;
a system processor, connected to the system transceiver;
a task generator obtaining messages produced by the system processor; and
a first beacon and a second beacon, each having identical electrical components comprising a first proximity sensor, a second proximity sensor and a transceiver;
wherein the first proximity sensor of the first beacon generates a sensor signal that causes the transceiver of the first beacon to send a first signal that is received by the system transceiver and is converted into a first message by the system processor;
wherein the first proximity sensor of the second beacon generates a sensor signal that causes the transceiver of the second beacon to send a second signal that is received by the system transceiver and is converted into a second message by the system processor; and
wherein the task generator interprets the first message as being related to a first task type and the second message as being related to a second task type.

13. The system of claim 12 wherein the first task type comprises assisting a guest and the second task type comprises cleaning an area.

14. The system of claim 12 wherein the first beacon and the second beacon have a same housing but the first beacon has a first label snap fit to the housing of the first beacon and the second beacon has a second label snap fit to the housing of the second beacon.

15. The system of claim 12 wherein the electrical components of the first beacon further comprise an integrated circuit and a processor wherein when the integrated circuit determines that the sensor signal of the first proximity sensor represents a detection event, the processor sets a timer and when the timer expires before the integrated circuit determines that a sensor signal of the second proximity sensor represents a detection event, the processor sends a third message through the transceiver.

16. The system of claim 15 wherein when the integrated circuit determines that the sensor signal represents the detection event, the processor sets a second timer such that the processor ignores detection events determined by the integrated circuit until the second timer expires.

17. The system of claim 15 wherein the electrical components of the first beacon further comprise a clock providing a current time, wherein the processor turns off the first proximity sensor and the second proximity sensor at a first time provided by the clock and turns back on the first proximity sensor and the second proximity sensor at a second time provided by the clock.

18. An apparatus comprising:
a processor;
an integrated circuit;
a first proximity sensor configured to provide a first sensor input to the integrated circuit;
a second proximity sensor configured to provide a second sensor input to the integrated circuit;
a clock providing a current time;
wherein the processor is configured to set a timer when the integrated circuit determines that the first sensor input represents a first detection event, such that the processor ignores detection events determined by the integrated circuit until the timer expires; and
wherein the processor is configured to turn off the first proximity sensor and the second proximity sensor at a first time provided by the clock and is configured to turn back on the first proximity sensor and the second proximity sensor at a second time provided by the clock.

19. An apparatus comprising:
a processor;
an integrated circuit;
a first proximity sensor configured to provide a first sensor input to the integrated circuit;
a second proximity sensor configured to provide a second sensor input to the integrated circuit;
a sound generator;
wherein the processor is configured to set a timer when the integrated circuit determines that the first sensor input represents a first detection event, such that the processor ignores detection events determined by the integrated circuit until the timer expires; and
wherein when the timer expires before the second proximity sensor provides the second sensor input, the processor is configured to cause the sound generator to generate a sound.

* * * * *